(12) United States Patent
Xie et al.

(10) Patent No.: US 12,317,537 B2
(45) Date of Patent: May 27, 2025

(54) REDUCED PARASITIC CAPACITANCE SEMICONDUCTOR DEVICE CONTAINING AT LEAST ONE LOCAL INTERCONNECT PASSTHROUGH STRUCTURE

(71) Applicant: International Business Machines Corporation, Armonk, NY (US)

(72) Inventors: Ruilong Xie, Niskayuna, NY (US); Dechao Guo, Niskayuna, NY (US); Junli Wang, Slingerlands, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 17/397,279

(22) Filed: Aug. 9, 2021

(65) Prior Publication Data

US 2023/0042567 A1   Feb. 9, 2023

(51) Int. Cl.
*H10D 30/00*   (2025.01)
*H10D 30/01*   (2025.01)
*H10D 30/62*   (2025.01)
*H10D 64/01*   (2025.01)

(52) U.S. Cl.
CPC ....... *H10D 30/6219* (2025.01); *H10D 30/024* (2025.01); *H10D 30/6211* (2025.01); *H10D 64/01* (2025.01); *H10D 64/017* (2025.01)

(58) Field of Classification Search
CPC .. H10K 50/865; H10K 50/824; H10K 59/122; H10K 59/35; H10K 59/38; H10K 50/856; H10K 59/878; H10D 30/024; H10D 30/6211; H10D 84/0158
See application file for complete search history.

(56) References Cited

U.S. PATENT DOCUMENTS

| | | |
|---|---|---|
| 6,630,699 B1 | 10/2003 | Wylie |
| 6,838,869 B1 | 1/2005 | Rogers et al. |
| 8,455,932 B2 | 6/2013 | Khakifirooz et al. |
| 9,373,641 B2 | 6/2016 | Anderson et al. |
| 9,536,980 B1 | 1/2017 | Huang et al. |
| 9,601,366 B2 | 3/2017 | Greene et al. |
| 9,627,270 B2 * | 4/2017 | Cheng ............ H01L 21/823807 |
| 9,972,495 B1 | 5/2018 | Wu |
| 10,056,468 B2 | 8/2018 | Samavedan et al. |
| 10,074,571 B1 * | 9/2018 | Greene .......... H01L 21/823437 |
| 10,177,038 B1 * | 1/2019 | Lee ....................... H01L 23/485 |
| 10,366,930 B1 | 7/2019 | Xie et al. |
| 10,580,773 B2 | 3/2020 | Bergendahl et al. |
| 2014/0203376 A1 | 7/2014 | Xie et al. |

(Continued)

*Primary Examiner* — Vu A Vu
*Assistant Examiner* — Valerie N Newton
(74) *Attorney, Agent, or Firm* — Scully, Scott, Murphy & Presser, P.C.; L. Jeffrey Kelly, Esq.

(57) ABSTRACT

A semiconductor device is provided that includes a local passthrough interconnect structure present in a non-active device region of the device. A dielectric fill material structure is located between the local passthrough interconnect structure and a functional gate structure that is present in an active device region that is laterally adjacent to the non-active device region. The semiconductor device has reduced capacitance (and thus circuit speed is not compromised) as compared to an equivalent device in which a metal-containing sacrificial gate structure is used instead of the dielectric fill material structure.

19 Claims, 7 Drawing Sheets

(56) References Cited

U.S. PATENT DOCUMENTS

| | | | |
|---|---|---|---|
| 2016/0104645 A1* | 4/2016 | Hung | H01L 27/0886 438/586 |
| 2016/0233298 A1 | 8/2016 | Webb et al. | |
| 2018/0277655 A1 | 9/2018 | Samavedan et al. | |
| 2020/0058747 A1* | 2/2020 | Fang | H01L 21/76816 |
| 2021/0083112 A1* | 3/2021 | Wu | H01L 21/02211 |

* cited by examiner

REDUCED PARASITIC CAPACITANCE SEMICONDUCTOR DEVICE CONTAINING AT LEAST ONE LOCAL INTERCONNECT PASSTHROUGH STRUCTURE

BACKGROUND

The present application relates to semiconductor technology, and more particularly to a semiconductor device having reduced parasitic capacitance and at least one local interconnect passthrough structure.

In 7 nm and beyond semiconductor technology, a local interconnect passthrough structure is used as an inter-cell connection that allows current signals to pass across an n-type field effect transistor (NFET) region and a p-type field effect transistor (NFET) region or across transistors in different cells. However, in prior semiconductor devices, a local interconnect passthrough structure is formed laterally adjacent to an electrically conductive metal-containing sacrificial gate structure. In such prior semiconductor devices, the semiconductor device exhibits reduced circuit speed due to a large parasitic capacitance that occurs between the local interconnect passthrough structure and the laterally adjacent electrically conductive metal-containing sacrificial gate structure. There is thus a need for providing a reduced parasitic capacitance semiconductor device that contains a local interconnect passthrough structure.

SUMMARY

A semiconductor device is provided that includes a local passthrough interconnect structure present in a non-active device region of the device. A dielectric fill material structure is located between the local passthrough interconnect structure and a functional gate structure that is present in an active device region that is laterally adjacent to the non-active device region. The semiconductor device has reduced capacitance (and thus circuit speed is not compromised) as compared to an equivalent device in which a metal-containing sacrificial gate structure is used instead of the dielectric fill material structure. As used herein, the term "local passthrough interconnect structure" denotes a structure that extends from one complementary metal oxide semiconductor (CMOS) cell to a boundary of at least one other CMOS cell. That is to say, the local passthrough structure extends across more than one CMOS cell.

In one aspect of the present application, a semiconductor device having reduced parasitic capacitance is provided. In one embodiment, the semiconductor device comprises an active device region including at least one functional gate structure located on a surface of an active semiconductor channel containing structure. A non-active device region including a local interconnect passthrough structure is located laterally adjacent to the active device region. In accordance with the present application, a dielectric fill material structure is located between the functional gate structure and the local interconnect passthrough structure.

In another aspect of the present application, a method of forming a semiconductor device having reduced parasitic capacitance is provided. In one embodiment, the method includes forming a structure including an active device region and a laterally adjacent non-active device region, wherein the active device region includes an active semiconductor channel containing structure and at least one sacrificial gate structure, and the non-active device region includes at least one other sacrificial gate structure located at an end of the active semiconductor channel containing structure in the active device region. Next, the at least one other sacrificial gate structure in the non-active device region is selectively removed, while maintaining the at least one sacrificial gate structure in the active device region. A dielectric fill material structure is then formed in an area previously occupied by the at least one other sacrificial gate structure. Next, the at least one sacrificial gate structure in the active device region is replaced with a functional gate structure, and thereafter a local interconnect passthrough structure is formed in the non-active device region.

DETAILED DESCRIPTION

Figure 1A:
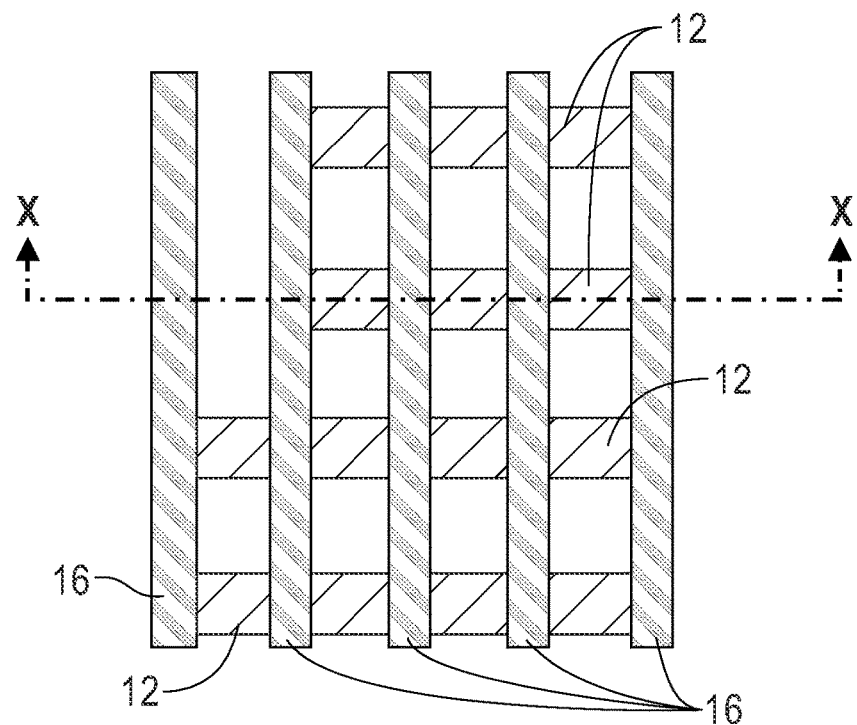
FIG. 1A is to a top down view of an exemplary semiconductor device layout that can be employed in accordance with an embodiment of the present application, the semiconductor device layout includes a plurality of semiconductor fins oriented along a first direction, and a plurality of sacrificial gate structures that are oriented in a second direction which is perpendicular to the first direction.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first FIG. 1A, there is illustrated an exemplary semiconductor device layout that can be employed in accordance with an embodiment of the present application. The exemplary semiconductor device layout shown in FIG. 1A includes a plurality of semiconductor fins 12 oriented along a first direction, and a plurality of sacrificial gate structures 16 that are oriented in a second direction which is perpendicular to the first direction. FIG. 1A includes a cut X-X which will be used herein to illustrate the semiconductor device of the present application. Cut X-X is through an active device region that includes one of the semiconductor fins 12 shown in FIG. 1A, and into a non-active device region that is located laterally adjacent to the active device region. In some embodiments, the semiconductor fin 12 that is present in the X-X cut can be a non-cut semiconductor fin. While in other embodiments, the semiconductor fin 12 that is present in the X-X cut can be a cut semiconductor fin. It is noted that although the present application describes and illustrates semiconductor fins 12 as an active semiconductor channel containing structure, the present application contemplates using other types of active semiconductor channel containing structures (such as, for example, semiconductor nanosheets or semiconductor nanowires) besides semiconductor fins 12.

It is noted that in the present application, FIGS. 1A, 2A, 3A, 4A, 5A and 6A illustrate the exemplary semiconductor layout (simplified top down view thus some elements are not shown for clarity) after different processing steps of the present application, while FIGS. 1B, 2B, 3B, 4B, 4C, 5B and 6B illustrate the semiconductor device at cut X-X after different processing steps of the present application.

Figure 1B:
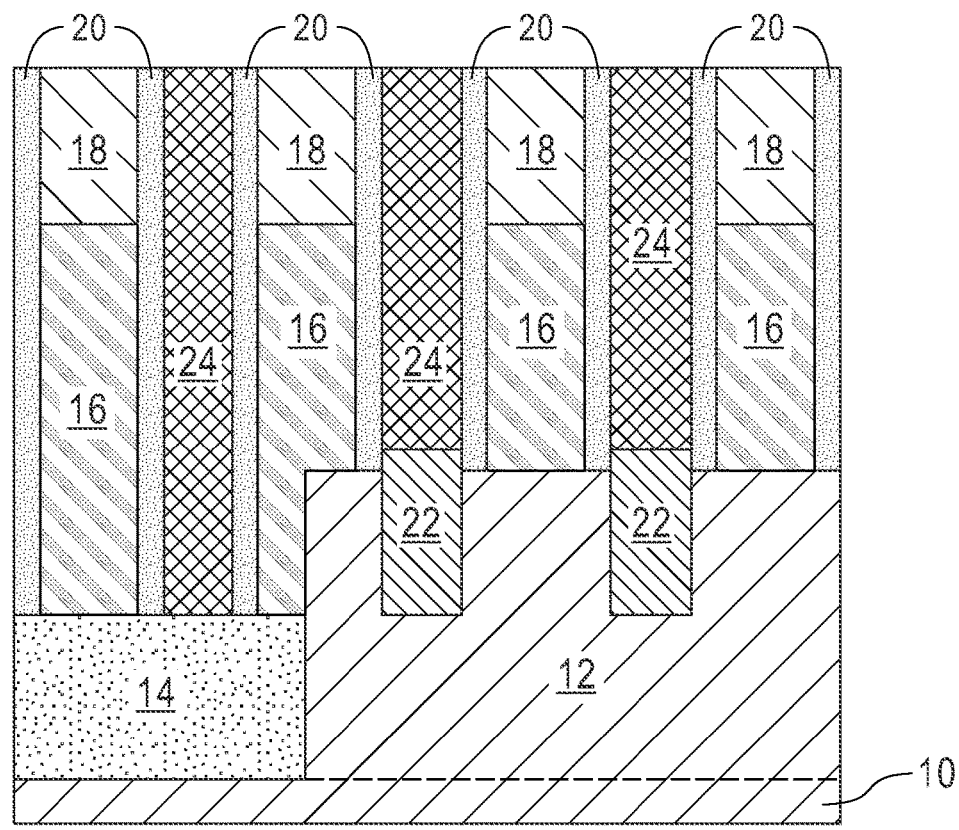
FIG. 1B is a cross sectional view of an exemplary semiconductor device through X-X shown in FIG. 1A that can be employed in accordance with an embodiment of the present application, the exemplary semiconductor device includes an active device region and a laterally adjacent non-active device region, wherein the active device region includes a semiconductor fin and at least one sacrificial gate structure, and the non-active region includes at least one other sacrificial gate structure located on a surface of a shallow trench isolation structure and at an end of the semiconductor fin in the active device region.

Referring now to FIG. 1B, there is illustrated an exemplary semiconductor device through X-X shown in FIG. 1A that can be employed in accordance with an embodiment of the present application. The exemplary semiconductor device includes an active device region and a laterally adjacent non-active device region. The active device region includes a semiconductor fin 12 and at least one sacrificial gate structure 16/18, and the non-active region includes at least one other sacrificial gate structure 16/18 located on a surface of a shallow trench isolation structure 14 and at an end of the semiconductor fin 12 in the active device region. The at least one other sacrificial gate structure 16/18 that is located on a surface of the shallow trench isolation structure 14 and at the end of the semiconductor fin 12 can contact a sidewall edge of the semiconductor fin 12 and it can extend onto a topmost surface of the semiconductor fin 12. Additional sacrificial gate structure 16/18 as shown in FIG. 1 can be present on the shallow trench isolation structure 14 and the semiconductor fin 12. The shallow trench isolation structure 14 and the semiconductor fin 12 are located on a surface of substrate 10.

A dielectric spacer 20 can be present along the sidewall of each sacrificial gate structure 16/18. Within the active device region, source/drain regions 22 can be present on each side of the at least one of sacrificial gate structure 16/18 that is present on the semiconductor fin 12. An interlayer dielectric (ILD) material layer 24 can be formed between each sacrificial gate structure 16/18. The ILD material layer 24 can have a topmost surface that is coplanar with a topmost surface of each sacrificial gate structure 16/18.

The exemplary semiconductor device shown in FIG. 1B can be formed utilizing various processing techniques that are well known to those skilled in the art. For example, semiconductor fins 12 can be formed by patterning a substrate including at least an upper semiconductor material portion, the shallow trench isolation structure 14 can be formed by deposition of a dielectric material, followed by a CMP and an etch back process, the sacrificial gate structure 16/18 can be formed by deposition of a sacrificial gate material stack and then patterning the sacrificial gate material stack, the dielectric spacer 20 can be formed by deposition of a dielectric spacer material, followed by a spacer etch, the source/drain regions 22 can be formed by an epitaxial growth process in which the dopants can be added during the epitaxial growth process or after the epitaxial growth process, and the ILD material layer 24 can be formed by depositing an ILD material, and optionally performing a planarization process such as, for example, chemical mechanical polishing (CMP). Other processing techniques besides those mentioned hereinabove can be used to form any of the elements of the exemplary semiconductor structure shown in FIG. 1B. For example, the source/drain regions 22 can be formed by ion implantation into a semiconductor material portion of a semiconductor substrate.

In one embodiment of the present application, substrate 10 can be entirely composed of one or more semiconductor materials. Examples of semiconductor materials that can be used to provide the substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In such an embodiment, substrate 10 can be referred to a bulk semiconductor substrate.

In another embodiment of the present application, substrate 10 can be composed of a multilayered stack of from bottom to top, a semiconductor material layer, and an insulator material layer. In such an embodiment, the semiconductor material layer can be composed of at least one of the semiconductor materials mentioned above, and the insulator material layer can be composed of a dielectric material such as, for example, silicon oxide, and/or boron nitride.

In yet another embodiment, substrate 10 is composed entirely of a dielectric material such as, for example, silicon oxide, silicon nitride, or silicon oxynitride.

The semiconductor fin 12 (or active semiconductor channel containing structure) is composed of one of the semiconductor materials mentioned above for substrate 10; note other semiconductor fins 12 as shown in FIG. 1A are also present in the semiconductor device layout. The semiconductor material that provides each semiconductor fin 12 can be compositionally the same as, or compositionally different from, at least an uppermost semiconductor material portion of substrate 10. In some embodiments, each semiconductor fin 12 is composed of a compositionally same semiconductor material. In other embodiments, a first set of semiconductor fins can be composed of first semiconductor material that is capable of providing high channel mobility for NFET devices, while a second set of semiconductor fins can be composed of a second semiconductor material that is compositionally different from the first semiconductor material and is capable of providing high channel mobility for PFET devices. In some of the drawings, a dotted line is shown between the substrate 10 and each semiconductor fin 12 to show a possible location of a material interface between the substrate 10 and the semiconductor fins 12.

Each semiconductor fin 12 is oriented parallel to each other. Each semiconductor fin 12 typically has a same height and width. In one example, each semiconductor fin 12 has a height as measured from a topmost surface of the substrate 10 to the topmost surface of the semiconductor fin, of from 30 nm to 200 nm, and a width, as measured from one sidewall surface of a semiconductor fin 12 to an opposing sidewall surface of the same semiconductor fin 12, of from 5 nm to 20 nm. Other heights and widths besides those mentioned herein are contemplated and can thus be employed in the present application.

The shallow trench isolation structure 14, which is located on the substrate 10, is present in the non-active device region, and is positioned laterally adjacent to a lower portion of semiconductor fin 12 shown in FIG. 1B, can be composed of a dielectric material such as, for example, silicon dioxide, silicon nitride, silicon oxynitride, or any suitable combination of those dielectric materials. The shallow trench isolation structure 14 has a height that is less than a height of each semiconductor fin 12 so that an upper portion of each semiconductor fin 12 is physically exposed and can be used as active channel of a FET device. In some embodiments, especially when at least an upper portion of substrate 10 is composed of a dielectric material, shallow trench isolation structure 14 can be omitted. The height of the active semiconductor fin channel (from a topmost surface of the shallow trench isolation structure 14 to the topmost surface of the semiconductor fin 12) ranges from 15 nm to 100 nm.

The sacrificial gate structures 16/18 include at least a sacrificial gate material layer 16. An optional sacrificial hard mask cap 18 can be present on a topmost surface of the sacrificial gate material layer 16. In some embodiments, a thin sacrificial gate dielectric material layer (not shown) can be present beneath the sacrificial gate material layer 16. Each sacrificial gate structure 16/18 is oriented perpendicular to each semiconductor fin 12. At least one of the sacrificial gate structures 16/18 passes over a portion of each semiconductor fin 12 that is present in the active device region, while at least one other sacrificial gate structures 16/18 is located on the shallow trench isolation structure 14 (or on substrate 10, if the shallow trench isolation structure 14 is not present).

The sacrificial gate material layer 16 can be composed of a sacrificial gate material including, but not limited to, polysilicon, amorphous silicon, amorphous silicon germanium, tungsten, titanium, tantalum, aluminum, nickel, ruthenium, palladium, platinum, or alloys of such metals. When a semiconductor material is used as the sacrificial gate material, the semiconductor material that provides the sacrificial gate material layer 16 is compositionally different from the semiconductor material that provides each semiconductor fin 12, or a thin layer of dielectric is present between the sacrificial gate material 16 and semiconductor fin 12 if both are made with same material, e.g., Si.

The optional sacrificial hard mask cap 18 can be composed of a hard mask dielectric material such as, for example, silicon oxide, silicon nitride or silicon oxynitride. The hard mask dielectric material that provides the optional sacrificial hard mask cap 18 can be compositionally the same as, or compositionally different from the dielectric material that provides the shallow trench isolation structure 14.

The dielectric spacer 20 is composed of a dielectric spacer material such as, for example, silicon oxide, silicon nitride, or silicon oxynitride. In some embodiments, and as is illustrated in FIG. 1B, the dielectric spacer 20 is pillar shaped and has a topmost surface that is coplanar with a topmost surface of each of the optional hard mask cap 18 and the ILD material layer 24 to be subsequently formed. When the optional sacrificial hard mask cap 18 is omitted (not shown), the dielectric spacer 20 has a topmost surface that is coplanar with a topmost surface of each of the sacrificial gate material layer 16 and the ILD material layer 24 to be subsequently formed.

The source/drain regions 22 are composed of a semiconductor material and a dopant. As used herein, a "source/drain" region can be a source region or a drain region depending on subsequent wiring and application of voltages during operation of the field effect transistor (FET). The semiconductor material that provides the source/drain regions 22 can include one of the semiconductor materials mentioned above for the substrate 10. The semiconductor material that provides the source/drains regions 22 can be compositionally the same as, or compositionally different from, the semiconductor material that provides each semiconductor fin. The dopant that is present in the source/drain regions 22 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions 22 can have a dopant concentration of from $4\times10^{20}$ atoms/cm$^3$ to $3\times10^{21}$ atoms/cm$^3$.

The ILD material layer 24 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 24 can include a multilayered structure that includes at least two different dielectric materials stacked one atop the other such as, for example, silicon nitride and silicon dioxide.

Figure 2A:
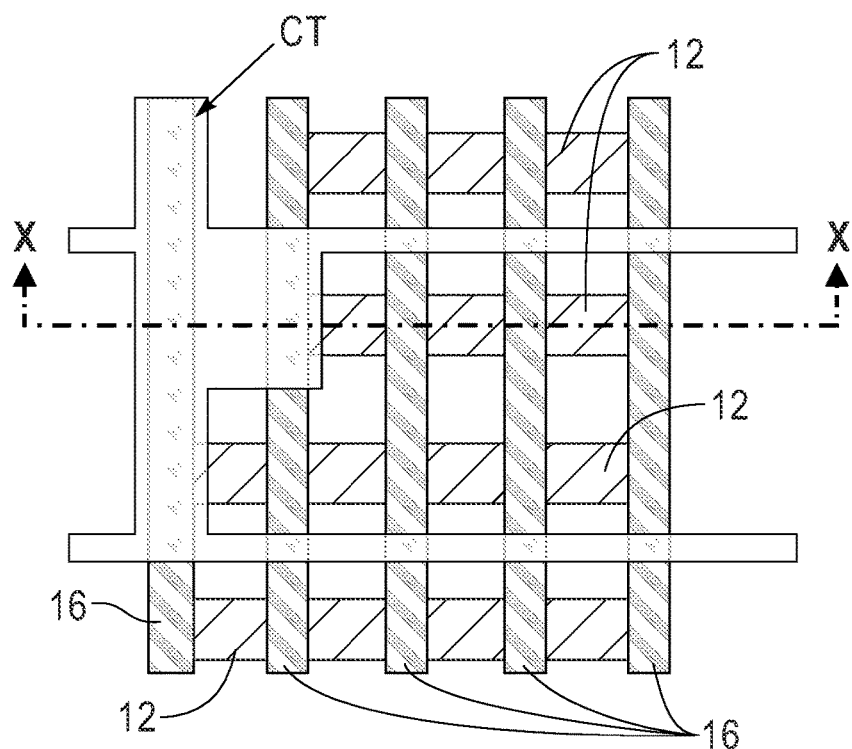
FIG. 2A is to a top down view of the exemplary semiconductor device layout of FIG. 1A after forming a gate cut mask covering at least a portion of the active device region.
Figure 2B:
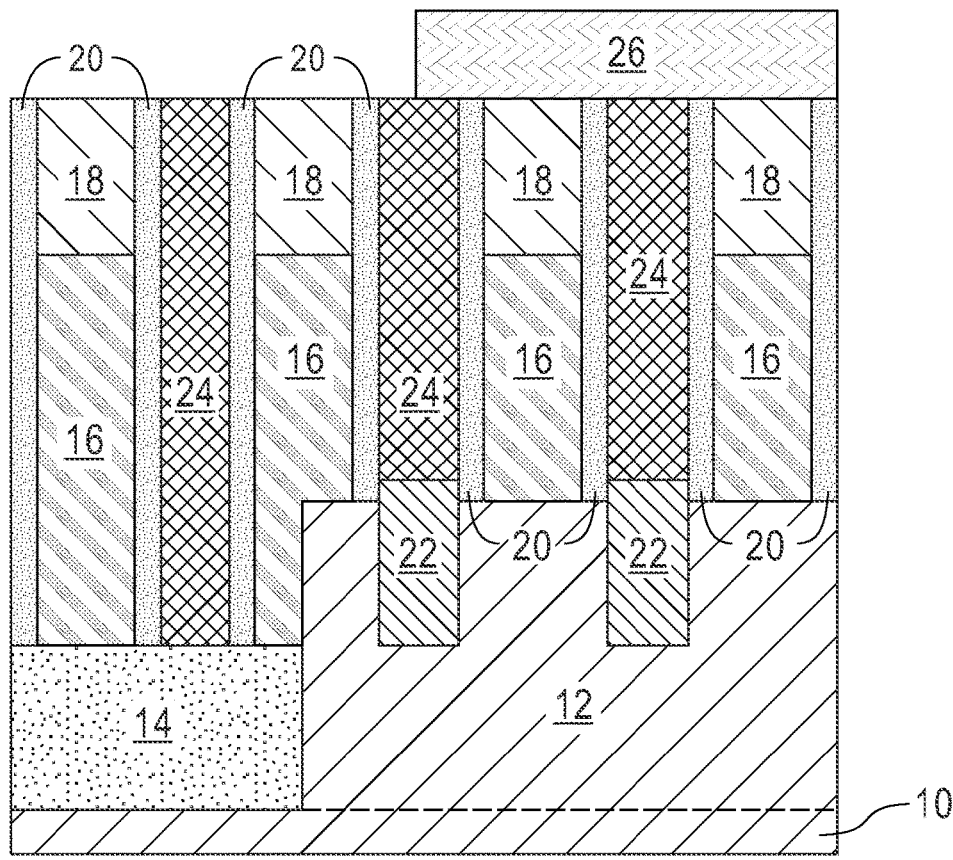
FIG. 2B is a cross sectional view of the exemplary semiconductor device shown in FIG. 1B after forming a gate cut mask covering at least a portion of the active device region.

Referring now to FIGS. 2A-2B, there are shown the exemplary semiconductor device layout of FIG. 1A, and the exemplary semiconductor device of FIG. 1B, respectively, after forming a gate cut mask 26 covering at least a portion of the active device region; the non-active device region including the sacrificial gate structure 16/18 that is located at the edge of semiconductor fin 12 is left physically exposed. See, for example, FIG. 2B. In FIG. 2A, CT denotes the gate cut region.

The gate cut mask 26 can be composed of an organic planarization layer (OPL) and it can be formed by first depositing a blanket layer of OPL, and then patterning the OPL by lithography and etching.

Figure 3A:
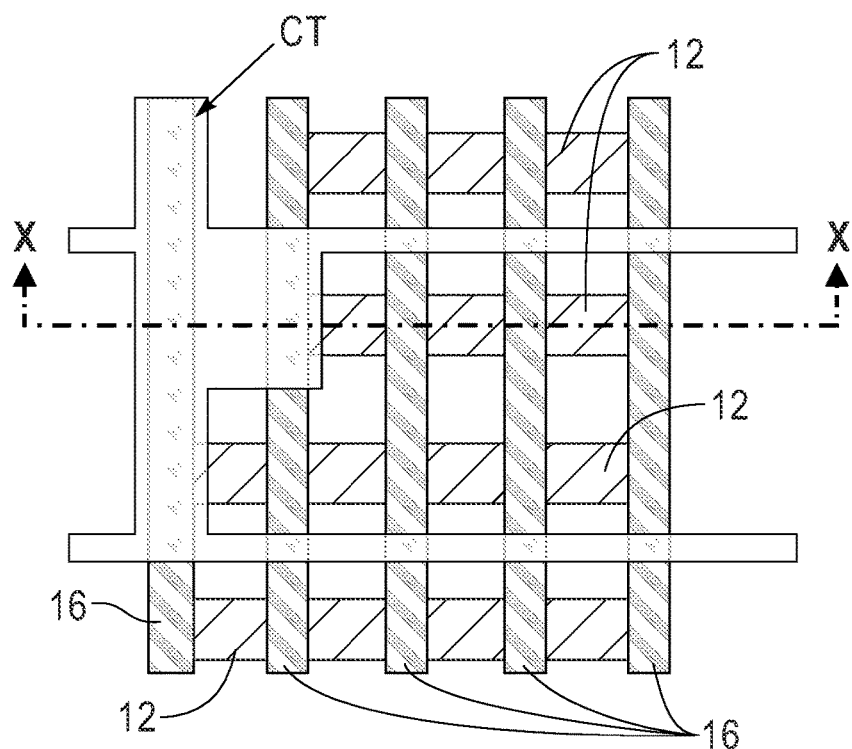
FIG. 3A is to a top down view of the exemplary semiconductor device layout of FIG. 2A after removing the at least one other sacrificial gate structure in the non-active device region that is not protected by the gate cut mask.
Figure 3B:
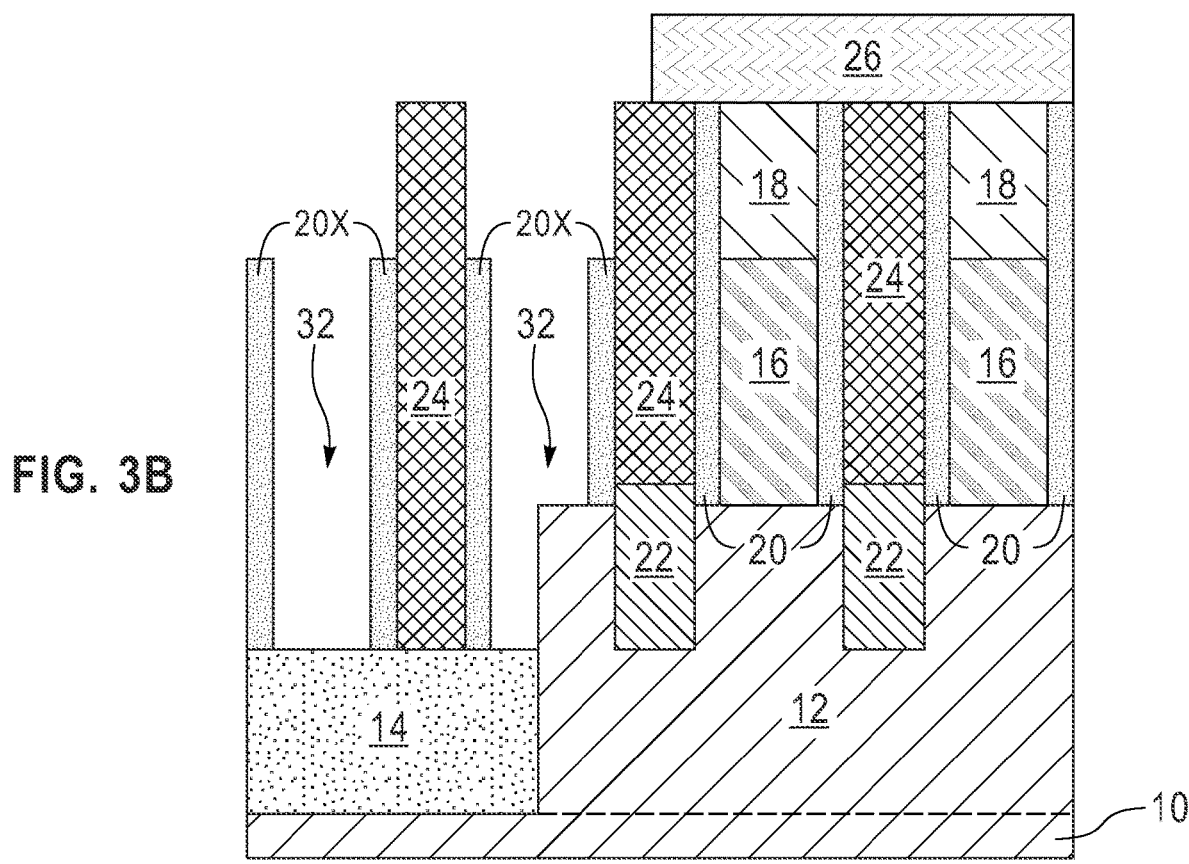
FIG. 3B is a cross sectional view of the exemplary semiconductor device shown in FIG. 2B after removing the at least one other sacrificial gate structure in the non-active device region that is not protected by the gate cut mask.

Referring now to FIGS. 3A-3B, there are shown the exemplary semiconductor device layout of FIG. 2A, and the exemplary semiconductor device of FIG. 2B, respectively, after removing the at least one other sacrificial gate structure 16/18 in the non-active device region that is not protected by the gate cut mask 26. It is noted that all sacrificial gate structures 16/18 that are present in the non-active device region are removed at this point of the present application.

Each physically exposed sacrificial gate structure 16/18 not covered by gate cut mask 26 is removed utilizing the gate cut mask 26 as an etch mask and utilizing one or more etching processes. In some embodiments not shown in the drawings, the removal of the physically exposed sacrificial gate structure 16/18 also removes a portion of the semiconductor fin 12. In other embodiments and as is illustrated in FIG. 3B, the semiconductor fin 12 is not cut during this step of the present application. In some embodiments, the removal of the physically exposed sacrificial gate structure 16/18 can be performed utilizing a single etching process.

During this step of the present application, an upper portion of the dielectric spacers 20 that are not covered by the gate cut mask 26 can be removed to provide reduced height dielectric spacers. The reduced height dielectric spacers are used as spacers for a subsequently formed dielectric fill material structure. Thus, the reduced height dielectric spacers can be referred to as non-gate dielectric spacers 20X. The removal of the upper portion of the non-protected dielectric spacers 20 can occur utilizing one of the etching steps used to remove the non-protected functional gate structure 16/18. Alternatively, a separate etch can be employed to reduce the height of the dielectric spacers 20 in the non-active device region after removing the non-protected dielectric spacers 20.

The removal of each sacrificial gate structures 16/18 and the upper portion of the dielectric spacers 20 not protected by the gate cut mask 26 provides a gate cut trench 32. Each gate cut trench 32 defines an area located between each remaining pair of reduced height dielectric spacers (i.e., non-gate dielectric spacers 20X).

Figure 4A:
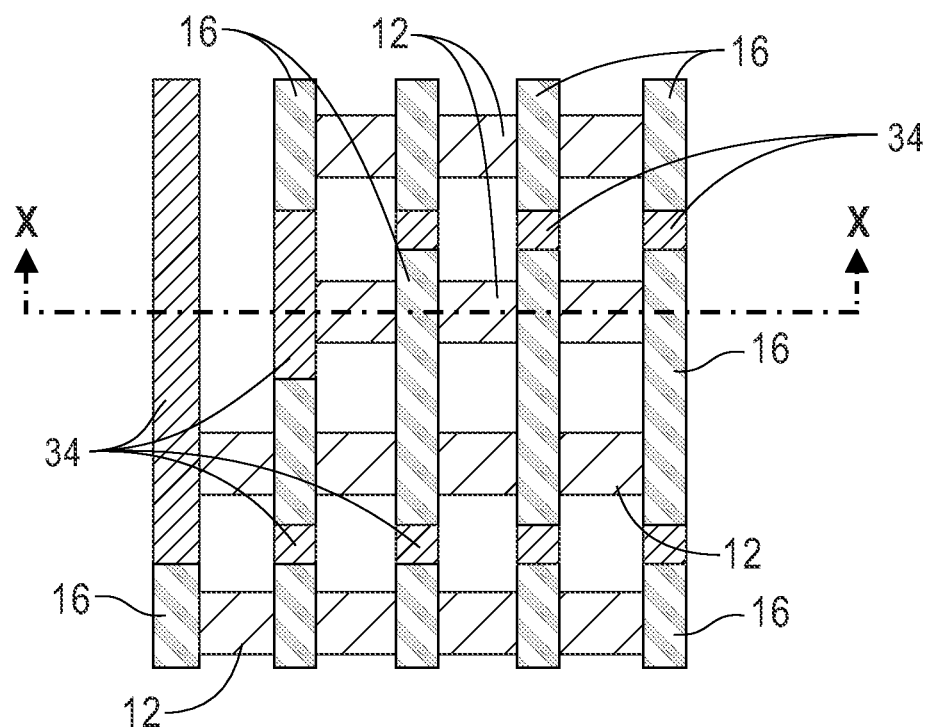
FIG. 4A is to a top down view of the exemplary semiconductor device layout of FIG. 3A after filling the area that previously included the at least one other sacrificial gate structure with a dielectric fill material, and performing a planarization process.
Figure 4B:
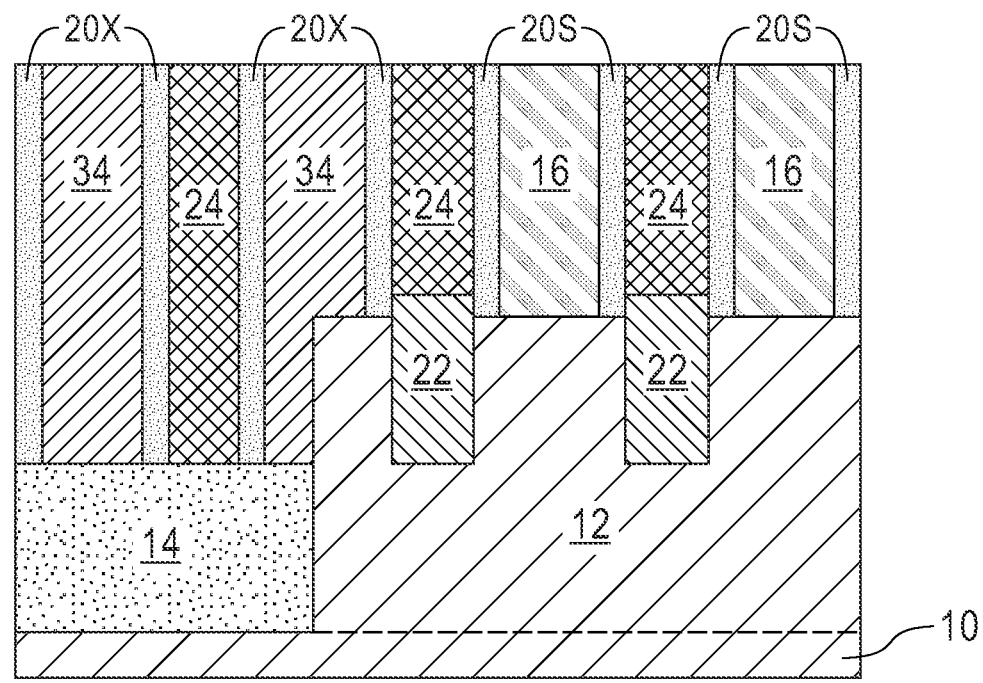
FIG. 4B is a cross sectional view of the exemplary semiconductor device shown in FIG. 3B after filling the area that previously included the at least one other sacrificial gate structure with a dielectric fill material, and performing a planarization process.

Referring now to FIGS. 4A-4B, there are shown the exemplary semiconductor device layout of FIG. 3A, and the exemplary semiconductor device of FIG. 3B, respectively, after filling the area (i.e., the gate cut trench 32) that previously included the at least one other sacrificial gate structure 16/18 with a dielectric fill material, and performing a planarization process to provide a dielectric fill material structure 34. Prior to forming the dielectric fill material structure 34, the gate cut mask 26 can be removed from the exemplary structure utilizing a material removal process such as, for example, stripping.

The dielectric fill material structure 34 is composed of a dielectric fill material that is compositionally different from the dielectric materials that provides the dielectric spacers 20 and the ILD material layer 24. In one embodiment, the dielectric fill material that provides the dielectric fill material structure 34 is a silicon nitride based dielectric material such as, for example, silicon nitride, silicon boron carbon nitride, or a dielectric including atoms of Si, O, C and N. In another embodiment, the dielectric fill material that provides the dielectric fill material structure 34 is composed of a silicon carbon based dielectric material such as, for example, silicon carbide or a dielectric including atoms of Si, C and O. Other dielectric materials besides a silicon nitride based dielectric and a silicon carbon based dielectric material can be used as the dielectric fill material. The dielectric fill material can be formed atomic layer deposition (ALD), chemical vapor deposition (CVD), plasma enhanced chemical vapor deposition (PECVD), physical vapor deposition (PVD), evaporation or spin-on coating.

After forming the dielectric fill material, a planarization process such as, for example, CMP, can be employed to remove the dielectric fill material outside of the gate cut region 32. The dielectric fill material that remains after the planarization process provides the dielectric fill material structure 34 of the present application. The dielectric fill material structure 34 is laterally surrounded by the non-gate dielectric spacers 20X.

The planarization process that provides the dielectric fill material structure 34 stops on a topmost surface of the sacrificial gate material 16 that is present in the active device region. Thus, the planarization process also removes the sacrificial hard mask caps 18 and upper portion of the dielectric spacer 20 that are present in the active device region as well as an upper portion of the ILD material layer 24 that is present in each of the active device region and the non-active device region. The dielectric spacers 20 in the active device region now has a reduced height. The reduced height dielectric spacers 20 in the active device region can be referred to as gate dielectric spacers 20S.

After planarization, the resultant dielectric fill material structure 34 has a topmost surface that is coplanar with a topmost surface of each of the remaining ILD material layer 24, the non-gate dielectric spacers 20X, the gate dielectric spacers 20S, and the sacrificial gate material 16.

Figure 4C:
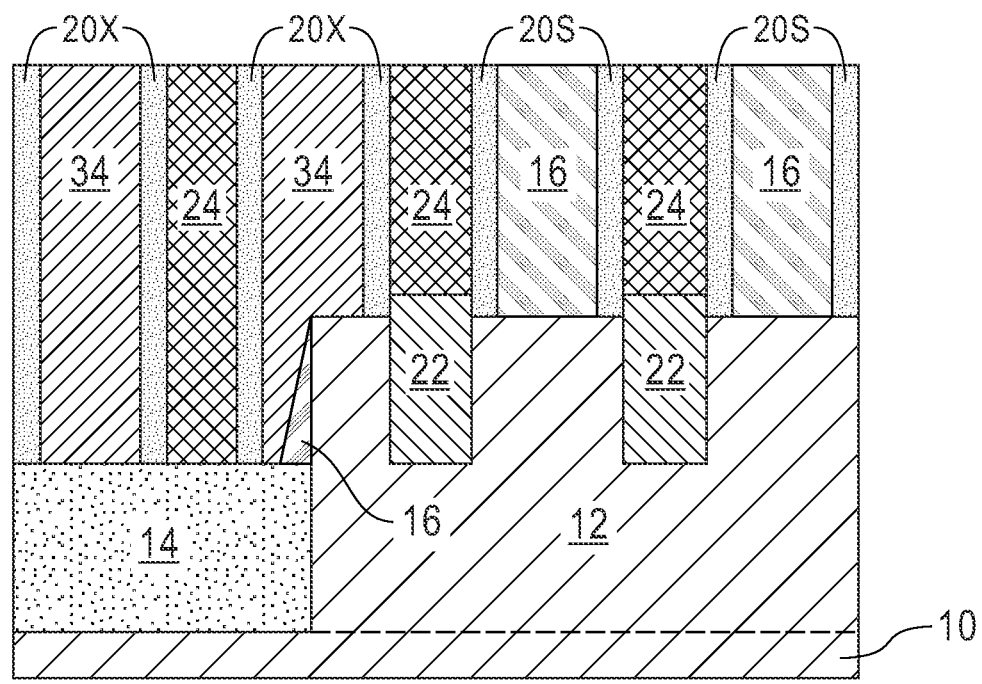
FIG. 4C is a cross sectional view of the exemplary semiconductor device shown in FIG. 2B after removing the at least one other sacrificial gate structure in the non-active device region that is not protected by the gate cut mask covering, filling the area previously included the at least one other sacrificial gate structure with a dielectric fill material, and performing a planarization process.

Referring is now made to FIG. 4C, there is shown the exemplary semiconductor device shown in FIG. 2B after removing the at least one other sacrificial gate structure in the non-active device region that is not protected by the gate cut mask covering, filling the area that previously included the at least one other sacrificial gate structure with a dielectric fill material, and performing a planarization process. In this embodiment, a portion of the sacrificial gate structure (particularly the sacrificial gate material 16) that is located at a sidewall edge of the semiconductor fin 12 can remain in the structure. In contrast, FIG. 4B shows an embodiment in which no portion of the sacrificial gate structure remains at the sidewall edge the semiconductor fin 12.

Figure 5A:
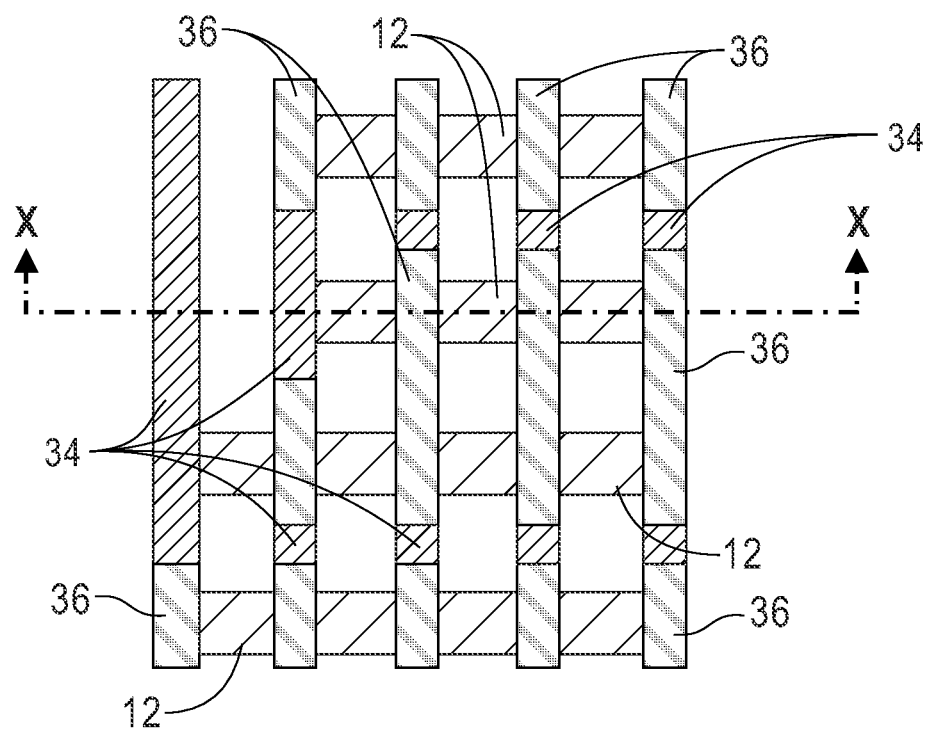
FIG. 5A is to a top down view of the exemplary semiconductor device layout of FIG. 4A after replacing the at least one sacrificial gate structure in the active device region with a functional gate structure.
Figure 5B:
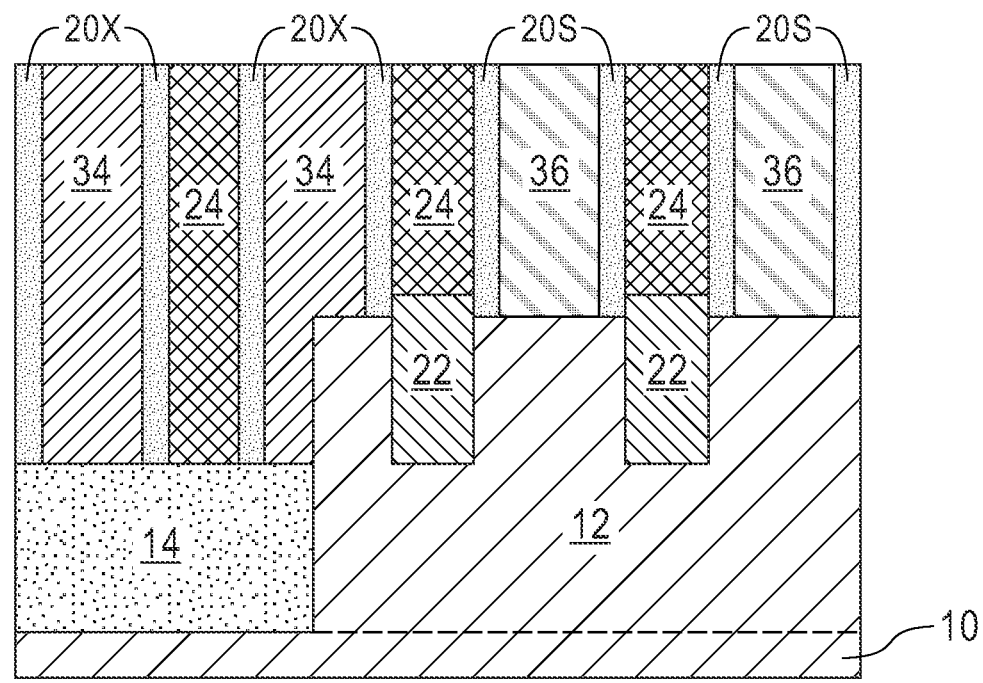
FIG. 5B is a cross sectional view of the exemplary semiconductor device shown in FIG. 4B after replacing the at least one sacrificial gate structure in the active device region with a functional gate structure.

Referring now to FIGS. 5A-5B, there are shown the exemplary semiconductor device layout of FIG. 4A, and the exemplary semiconductor device of FIG. 4B, respectively, after replacing the at least one sacrificial gate structure (i.e., the sacrificial gate material 16) in the active device region with a functional gate structure 36. Since the optional hard mask caps 18 were removed in a previously performed planarization process used to provide the exemplary semiconductor device of FIG. 5B, the sacrificial gate material layer 16 and, if present, the sacrificial gate dielectric material layer are removed during this step of the present application. The sacrificial gate material layer 16 and, if present, the sacrificial gate dielectric material layer can be removed utilizing an etching process(es) that is(are) selective in removing the sacrificial gate material layer 16 and if present, the sacrificial gate dielectric material layer relative to the other material layers that are present in the structure. The removal of each sacrificial gate structure in the active device region provides a gate cavity (not shown).

A functional gate structure 36 is then formed into each gate cavity. The functional gate structure 36 includes at least a gate dielectric material layer and a gate electrode; both of which are not individually shown in the drawings of the present application. In some embodiments, the gate dielectric material layer is U-shaped and is present along sidewalls and a bottom wall of the gate electrode. In other embodiments, the gate dielectric material layer is located entirely beneath the gate electrode. In some embodiments, the functional gate structure 36 includes a work function metal (WFM) layer located between the gate dielectric material layer and the gate electrode. In some embodiments, a gate cap (not shown) is located above a recessed functional gate structure 36 (also not shown).

The functional gate structure 36 includes forming a continuous layer of gate dielectric material and a gate electrode material inside and outside each gate cavity. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), and/or lead zinc niobite (Pb(Zn,Nb)O). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity 36.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity.

The remaining continuous layer of the gate dielectric material that is present inside each gate cavity can be referred to as a gate dielectric material layer, the remaining optional layer of WFM that is present inside the gate cavity can be referred to a WFM layer, and remaining gate electrode material that is present inside the gate cavity provides a gate electrode.

In some embodiments, the functional gate structure 36 is recessed and a gate cap (not shown) composed of the first dielectric material mentioned above for forming dielectric layer 30 is formed atop the functional gate structure 36 by deposition and planarization.

In some embodiments, block mask technology can be implemented to form functional gate structures 36 that are tailored for the specific device region, i.e., NFET device region or PFET device region.

Figure 6A:
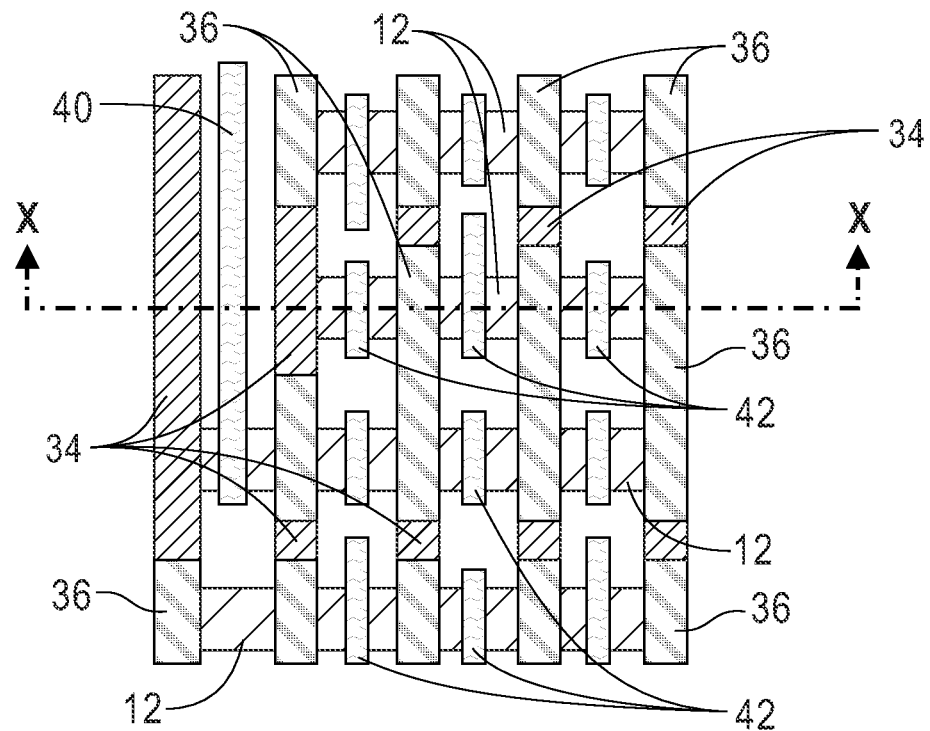
FIG. 6A is to a top down view of the exemplary semiconductor device layout of FIG. 5A after forming source/drain contact structures in the active device region, and a local interconnect passthrough structure in the non-active device region.
Figure 6B:
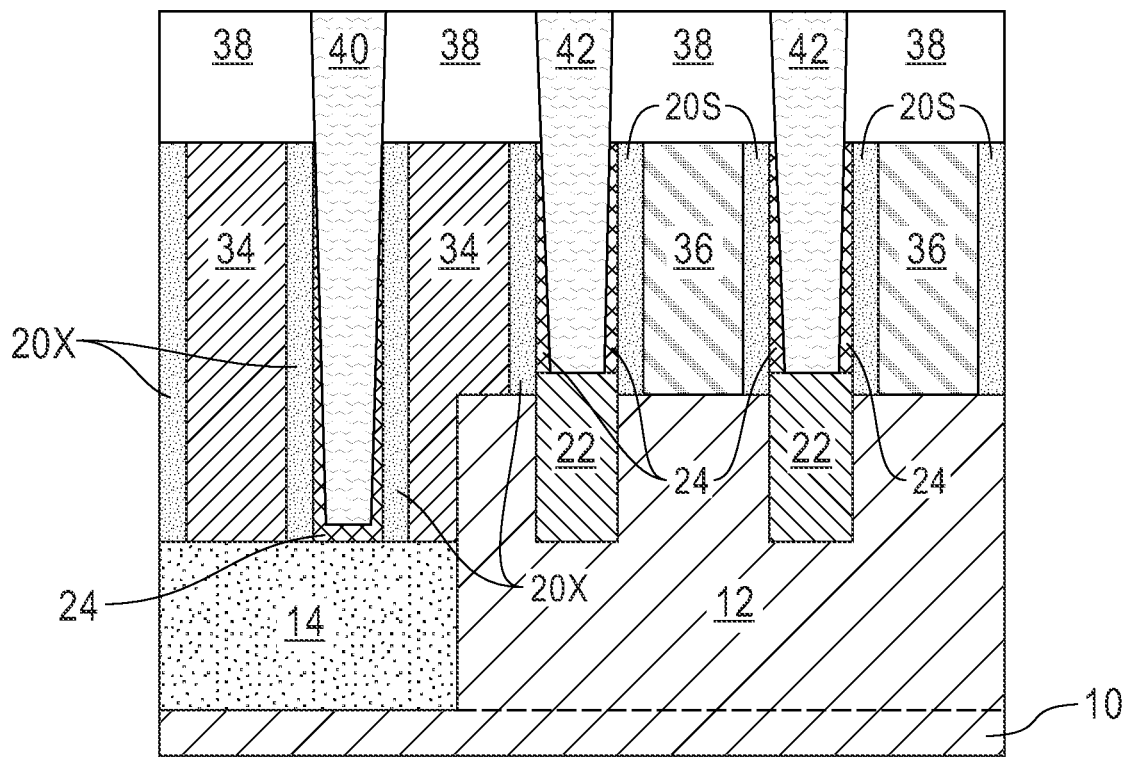
FIG. 6B is a cross sectional view of the exemplary semiconductor device shown in FIG. 5B after forming source/drain contact structures in the active device region, and a local interconnect passthrough structure in the non-active device region.

Referring now to FIGS. 6A-6B, there are shown the exemplary semiconductor device layout of FIG. 5A, and the exemplary semiconductor device of FIG. 5B, respectively, after forming source/drain contact structures 42 in the active device region, and a local interconnect passthrough structure 40 in the non-active device region.

The formation of the source/drain contact structures 42 and the local interconnect passthrough structure 40 includes forming a second ILD material 38 atop the exemplary semiconductor device shown in FIG. 5B. The second ILD material 38 includes one of the dielectric materials mentioned above for ILD material layer 24 (ILD material layer 24 can be referred as a first ILD material layer. The dielectric material that provides the second ILD material layer 38 can be compositionally the same as, or compositionally different from, the dielectric material that provides ILD material layer 24. The second ILD material layer 38 can be formed utilizing one of the one of the deposition processes mentioned above for providing ILD material layer 24.

Next source/drain contact openings (not shown) and a local interconnect passthrough opening (not shown) are formed by lithography and etching. The source/drain contact openings extend through the second ILD material layer 38 and the first ILD material layer 24, and physically expose a surface of the source/drain regions 22. The local interconnect passthrough opening extends entirely through the second ILD material layer 38 and at least partially though the first ILD material layer 24. In some embodiments, the local interconnect passthrough opening extends entirely through the first ILD material layer 24.

Source/drain contact structures 42 are formed into the source/drain contact openings, and the local interconnect passthrough structure 40 is formed into the local interconnect passthrough opening. The source/drain contact structures 42 can be formed prior to, simultaneously with, or after forming the local interconnect passthrough structure 40.

In some embodiments (not shown), a metal semiconductor alloy region can be formed in each of the source/drain contact openings and on an upper surface of the source/drain regions 22. The metal semiconductor alloy region can be composed of a silicide or germicide. In one or more embodiments of the present application, the metal semiconductor alloy region can be formed by first depositing a metal layer (not shown) in each of the source/drain contact openings and on an upper surface of the source/drain regions 22. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions 22 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. A source/drain contact material is then deposited in the source/drain contact openings to form the source/drain contact structures 42.

The source/drain contact structures 42 can include one or more source/drain contact liners (not shown) formed along sidewalls of the gate dielectric spacer 20S and above an upper surface of the source/drain regions 22. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

A contact conductor material is subsequently deposited into each of the source/drain contact openings to completely fill a remaining volume of the source/drain contact openings. The contact conductor material can include a metal such as, for example, W, Cu, Al, Co, Ru, Mo, Os, Ir, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the source/drain contact openings. The remaining contact conductor material and if present, the contact liner and the metal semiconductor alloy region provide source/drain contact structures 42.

Local interconnect passthrough structure 40 can be processed in a manner similar to that used in forming the source/drain contact structures 42 with the exception that no metal semiconductor alloy region is typically formed in the local interconnect passthrough structure 40. As a result of such processing, a local interconnect passthrough structure 40 is formed in the non-active device region. Local interconnect passthrough structure 40 includes a remaining portion of a contact conductor material and if present, a remaining portion of the contact liner. The local interconnect passthrough structure 40 can include a contact conductor material that is compositionally the same as, or compositionally different from, the contact conductor material that provides the source/drain contact structures 42. Also, the local interconnect passthrough structure 40 can include a contact liner that is compositionally the same as, or compositionally different from, the contact liner that provides the source/drain contact structures 42.

Notably, FIG. 6B illustrates an exemplary semiconductor device in accordance with an embodiment of the present application. The illustrated exemplary semiconductor device includes an active device region comprising at least one functional gate structure 36 located on a surface of an active semiconductor channel containing structure e.g., semiconductor fin 12). The illustrated semiconductor device further containing a non-active device region including a local interconnect passthrough structure 40 located laterally adjacent to the active device region. A dielectric fill material structure 34 is located between the functional gate structure 36 and the local interconnect passthrough structure 40. In some embodiments, a portion of a sacrificial gate structure 16 (e.g., the sacrificial dielectric material) is present along a sidewall edge of the active semiconductor channel containing structure (e.g., semiconductor fin 12) and is located within a lower portion of the dielectric fill material structure 34.

The terminology used herein is for the purpose of describing particular embodiments only and. is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:
   an active device region comprising at least one functional gate structure and located on a surface of an active semiconductor channel containing structure;
   a non-active device region comprising a local interconnect passthrough structure and located laterally adjacent to the active device region;
   a dielectric fill material structure present in both the active device region and the non-active device region and located between the functional gate structure and the local interconnect passthrough structure, wherein the dielectric fill material structure is in direct physical contact with a topmost surface and a sidewall edge of the active semiconductor channel containing structure and is entirely spaced apart from the local interconnect passthrough structure; and
   a non-gate dielectric spacer located on each side of the dielectric fill structure, wherein one of the non-gate dielectric spacers is present in the non-active device region, separates the dielectric fill structure from the local interconnect passthrough structure, and has a bottommost surface that is coplanar with a bottommost surface of the dielectric fill material structure.

2. The semiconductor device of claim 1, wherein the dielectric fill material structure is in direct physical contact with a surface of a trench isolation structure that is present in the non-active device region.

3. The semiconductor device of claim 1, further comprising a gate dielectric spacer located on a sidewall of the at least one functional gate structure.

4. The semiconductor device of claim 1, wherein the dielectric fill material structure has a topmost surface that is coplanar with a topmost surface of the at least one functional gate structure.

5. The semiconductor device of claim 1, further comprising a source/drain region located on each side of the at least one functional gate structure and contacting a surface of the active semiconductor channel containing structure.

6. The semiconductor device of claim 5, further comprising a source/drain contact structure contacting a surface of the source/drain region.

7. The semiconductor device of claim 6, wherein the local interconnect passthrough structure has a topmost surface that is coplanar with a topmost surface of each source/drain contact structure.

8. The semiconductor device of claim 1, wherein a portion of a sacrificial gate structure is present along the sidewall edge of the active semiconductor channel containing structure and is located within a lower portion of the dielectric fill material structure.

9. The semiconductor device of claim 1, wherein the active semiconductor channel containing structure is a semiconductor fin.

10. The semiconductor device of claim 1, further comprising another dielectric fill material structure located in the non-active device region, wherein the local interconnect passthrough structure is located between the dielectric fill material structure and the another dielectric fill material structure.

11. The semiconductor device of claim 1, wherein the local interconnect passthrough structure is spaced apart from a surface of a trench isolation structure by an interlayer dielectric material layer.

12. The semiconductor device of claim 1, wherein the local interconnect passthrough structure comprises at least a contact conductor material.

13. The semiconductor device of claim 1, wherein the dielectric fill material structure comprises a silicon nitride based dielectric material, or a silicon carbon based dielectric material.

14. A method of forming a semiconductor device, the method comprising:
   forming a structure comprising an active device region and a laterally adjacent non-active device region, wherein the active device region comprises an active semiconductor channel containing structure and at least one sacrificial gate structure, and the non-active device region comprises at least one other sacrificial gate structure located at an end of the active semiconductor channel containing structure in the active device region, wherein the at least other sacrificial gate structure is in direct physical contact with a topmost surface and a sidewall edge of the active semiconductor channel containing structure and wherein a gate dielectric spacer is present adjacent each side of the at least other sacrificial gate structure;
   selectively removing the at least one other sacrificial gate structure in the non-active device region, while maintaining the at least one sacrificial gate structure in the active device region, wherein during the selectively removing the at least one other sacrificial gate structure and an upper portion of each gate dielectric spacer present in the non-active device region is also removed to provide a non-gate dielectric spacer;
   forming a dielectric fill material structure in an area previously occupied by the at least one other sacrificial gate structure, wherein the dielectric fill material structure directly contacts the topmost surface and the sidewall edge of the active semiconductor channel containing structure;
   replacing the at least one sacrificial gate structure in the active device region with a functional gate structure; and
   forming a local interconnect passthrough structure in the non-active device region, wherein the non-gate dielectric spacer is located between the dielectric fill material structure and the local interconnect passthrough structure and has a bottommost surface that is coplanar with a bottommost surface of the dielectric fill material structure, and the dielectric fill material structure is entirely spaced apart from the local interconnect passthrough structure.

15. The method of claim 14, wherein the structure further comprises a source/drain region located on each side of the at least one sacrificial gate structure, and wherein after the replacing the at least one sacrificial gate structure in the active device region with the functional gate structure, the source/drain regions are on each side of the functional gate structure.

16. The method of claim 15, further comprises forming source/drain contact structures contacting a surface of the source/drain region.

17. The method of claim 14, wherein the selectively removing the at least one other sacrificial gate structure in the non-active device region comprises utilizing a gate cut mask.

18. The method of claim 14, wherein another dielectric fill material structure is formed on a side of the local interconnect passthrough structure that is opposite on side facing the dielectric fill material structure.

19. A semiconductor device comprising:
an active device region comprising at least one functional gate structure and located on a surface of an active semiconductor channel containing structure;
a non-active device region comprising a local interconnect passthrough structure and located laterally adjacent to the active device region, wherein the local interconnect passthrough structure has a bottommost surface landing directly on a surface of a trench dielectric isolation structure; and
a dielectric fill material structure located between the functional gate structure and the local interconnect passthrough structure, wherein the dielectric fill material structure is in direct physical contact with a topmost surface and a sidewall edge of the active semiconductor channel containing structure and is entirely spaced apart from the local interconnect passthrough structure.

* * * * *